United States Patent
Goh

(10) Patent No.: US 8,416,906 B2
(45) Date of Patent: Apr. 9, 2013

(54) CLOCK RESYNCHRONIZATION CIRCUIT AND METHOD

(75) Inventor: Beng-Heng Goh, Singapore (SG)

(73) Assignee: STMicroelectronics Asia Pacific PTE Ltd, Singapore (SG)

( * ) Notice: Subject to any disclaimer, the term of this patent is extended or adjusted under 35 U.S.C. 154(b) by 279 days.

(21) Appl. No.: 12/971,163

(22) Filed: Dec. 17, 2010

(65) Prior Publication Data

US 2012/0155588 A1    Jun. 21, 2012

(51) Int. Cl.
*H04L 7/00* (2006.01)
(52) U.S. Cl.
USPC .......................................................... 375/371
(58) Field of Classification Search .................. 375/371, 375/372, 373, 375, 376
See application file for complete search history.

(56) References Cited

U.S. PATENT DOCUMENTS

| | | | | |
|---|---|---|---|---|
| 6,008,699 A | * | 12/1999 | Parkhomenko et al. | 331/1 A |
| 7,911,909 B2 | * | 3/2011 | Nishiyama | 369/53.34 |

* cited by examiner

*Primary Examiner* — Jaison Joseph
(74) *Attorney, Agent, or Firm* — Gardere Wynne Sewell LLP

(57) ABSTRACT

A control circuit receives a first clock signal at a first frequency, a frequency division signal specifying a divisor number, and a second clock signal at a second frequency (higher than the first frequency). The control circuit includes a phase control block that defines non-overlapping portions of a pulse of the second clock to include center, left and right portions. A determination is then made as to whether an edge of the first clock is located within the center portion. In response to such a determination, a number of periods of the second clock signal which occur within one or more periods of the first clock signal is compared to a number derived from the divisor number to generate a frequency selection signal indicative of that comparison. A controlled oscillator circuit generates the second clock signal at the second frequency, wherein the second frequency is specified by the frequency selection signal. To the extent the edge of the first clock is located within either the left or right portions, phase adjustment is made to move the edge towards the center portion.

30 Claims, 11 Drawing Sheets

CLOCK RESYNCHRONIZATION CIRCUIT AND METHOD

TECHNICAL FIELD

The present invention relates to systems and methods for clock recovery.

BACKGROUND

Reference is made to FIG. 1 which illustrates a block diagram of a simplified communications system 10. The system 10 includes a transmitter (TX) 12 and a receiver (RX) 14. The transmitter 12 and receiver 14 are coupled through an interface 16. The interface 16 comprises a data bus connection 18 adapted to support parallel communication of a plurality of data bits (for example, eight bits of DATA[7:0]) from the transmitter 12 to the receiver 14. The interface 16 further comprises a clock connection 20 adapted to support communication of a clock signal (for example, on a single line, as a clock signal CLK_PAD) from the transmitter 12 to the receiver 14. The transmitter 12 and receiver 14 are typically circuits, such as integrated circuits, mounted to a circuit board (for example, a printed circuit board) 22. The circuit board 22 includes a plurality of electrical traces (not explicitly shown) coupled between the transmitter 12 and receiver 14 which provide the data bus connection 18 and clock connection 20.

The receiver 14 uses the received clock signal on the clock connection 20 to latch the received data bits on the data bus connection 18. For example, the receiver 14 may operate to latch data present on the data bus connection 18 at the leading edge of the received clock signal. Receipt of the clock signal is thus critical to proper operation of the receiver 14.

It is known by those skilled in the art that there is an upper limit to the frequency of the clock signal which can be transmitted over the circuit board 22 and received by the receiver 14. This upper limit will then impose a corresponding upper limit on the rate at which the data bits can be transmitted over the circuit board 22 and received by the receiver 14. For example, the circuit board 22 may not be able to support a clock signal CLK_PAD transmission at a frequency in excess of 100 MHz, and thus the rate of data bit transmission over the data bus connection 18 may be limited to about 50 MHz.

There is a need in the art to address the clock frequency upper limit issue noted above in connection with supporting the interfacing of a transmitter circuit and a receiver circuit, and more specifically to support DATA transmission over the data bus connection 18 at rates approaching the upper limit for the circuit board 22.

SUMMARY

In an embodiment, a clock recovery circuit comprises: a control circuit adapted to receive a first clock signal at a first frequency, a frequency division signal specifying a divisor number, and a second clock signal at a second frequency, wherein the second frequency is higher than the first frequency. The control circuit comprises: a phase control block adapted to define non-overlapping portions of a pulse of the second clock including a center portion, left portion and right portion and determine whether an edge of the first clock is located within the center portion; and a frequency control block responsive to the determination that the edge of the first clock is located within the center portion and adapted to compare a number of periods of the second clock signal which occur within one or more periods of the first clock signal to a number derived from the divisor number and generate a frequency selection signal in response thereto. The circuit further comprises: a controlled oscillator circuit adapted to generate the second clock signal at the second frequency, wherein the second frequency is specified by the frequency selection signal.

The phase control block is further adapted to determine whether an edge of the first clock is located within the left portion and in response thereto generate a phase adjustment signal. The second frequency of the second clock signal generated by the controlled oscillator circuit is specified by both the frequency selection signal and the phase adjustment signal. The phase adjustment signal causes the edge of the first clock to shift towards the center portion.

The phase control block is further adapted to determine whether an edge of the first clock is located within the right portion and in response thereto generate a phase adjustment signal. The second frequency of the second clock signal generated by the controlled oscillator circuit is specified by both the frequency selection signal and the phase adjustment signal. The phase adjustment signal causes the edge of the first clock to shift towards the center portion.

The control circuit is adapted to operate in a calibration mode and a lock mode. The calibration mode implements an interleaved actuation of the phase control block and frequency control block. The lock mode implements actuation only of the phase control block.

The control circuit is adapted to operate in a fast calibration mode, a fine calibration mode and a lock mode. The fast and fine calibration modes each implement interleaved actuation of the phase control block and frequency control block. The lock mode implements actuation only of the phase control block.

Actuation of the frequency control block in the fast calibration mode compares the number of periods of the second clock signal which occur within only one period of the first clock signal to the divisor number itself. The frequency selection signal is generated in response thereto.

Actuation of the frequency control block in the fine calibration mode compares the number of periods of the second clock signal which occur within a plurality of N periods of the first clock signal to the number equal to N times the divisor number. The frequency selection signal is generated in response thereto.

The frequency selection signal is generated by the frequency control block by execution of a binary search algorithm or an increment/decrement algorithm, wherein each increment or decrement is a single step.

The size of each of the center portion, left portion and right portion is either fixed or variable. When variable, the size of the center portion is wider during frequency selection and narrower during phase selection.

The frequency control block is further adapted to generate the frequency selection signal having a fractional value.

In another embodiment, a method is provided for implementing the operations described above in connection with the circuit.

BRIEF DESCRIPTION OF THE DRAWINGS

Reference will be made by way of example only to the accompanying drawings in which.

DETAILED DESCRIPTION OF THE DRAWINGS

Figure 1:
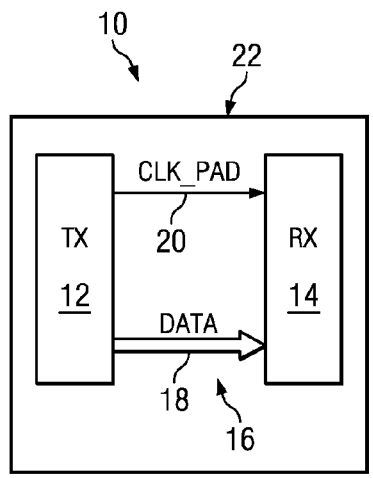
FIG. 1 is a block diagram of a simplified communications system in accordance with the prior art.
Figure 2:
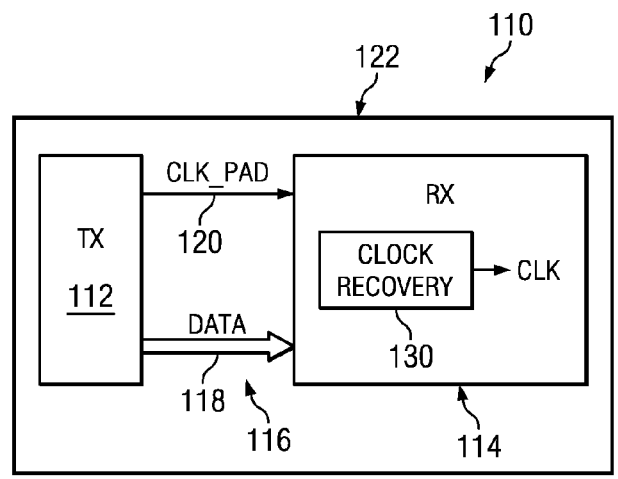
FIG. 2 is a block diagram of a communications system wherein the receiver includes a clock recovery circuit.

Reference is now made to FIG. 2 which illustrates a block diagram of a communications system 110. The system 110 includes a transmitter (TX) 112 and a receiver (RX) 114. The transmitter 112 and receiver 114 are coupled through an interface 116. The interface 116 comprises a data bus connection 118 adapted to support parallel communication of a plurality of data bits (for example, eight bits of DATA[7:0]) from the transmitter 112 to the receiver 114. The interface 116 further comprises a clock connection 120 adapted to support communication of a clock signal (for example, on a single line, as clock CLK_PAD) from the transmitter 112 to the receiver 114. The transmitter 112 and receiver 114 are typically circuits, such as integrated circuits, mounted to a circuit board (for example, a printed circuit board) 122. The circuit board 122 includes a plurality of electrical traces (not explicitly shown) coupled between the transmitter 112 and receiver 114 which provide the data bus connection 118 and clock connection 120.

The receiver 114 includes a clock recovery circuit 130. The clock recovery circuit 130 receives the clock signal CLK_PAD on the clock connection 120 and generates a clock signal CLK that is used internally within the receiver 114. For example, the clock signal CLK is used by the receiver to latch the received data bits on the data bus connection 118. For example, the receiver 114 may operate to latch data present on the data bus connection 118 at the leading edge of the generated clock signal CLK. In a preferred embodiment, the frequency of the generated clock signal CLK is greater than the frequency of the received clock signal CLK_PAD. More specifically, the frequency of the generated clock signal CLK is a multiple (for example, an integer multiple such as 6×) of the frequency of the received clock signal CLK_PAD). This allows the clock signal CLK_PAD to have a frequency compatible with the circuit board 122 (i.e., less than the upper limit for the frequency of signal transmission over the circuit board 122) while still supporting operation by the receiver 114 to receive and latch the data bits transmitted on the data bus connection 118 at frequencies approaching that upper limit. In a particular example, the clock signal CLK_PAD is configured to have a frequency of 20 MHz, while the data bits are transmitted over the data bus connection 118 at a frequency of 60 MHz and latched by the generated clock signal CLK at a frequency of 120 MHz. In another example, the clock signal CLK_PAD is configured to have a frequency of 20 MHz, while the data bits are transmitted over the data bus connection 118 at a frequency of 100 MHz and latched by the generated clock signal CLK at a frequency of 200 MHz.

Figure 3:
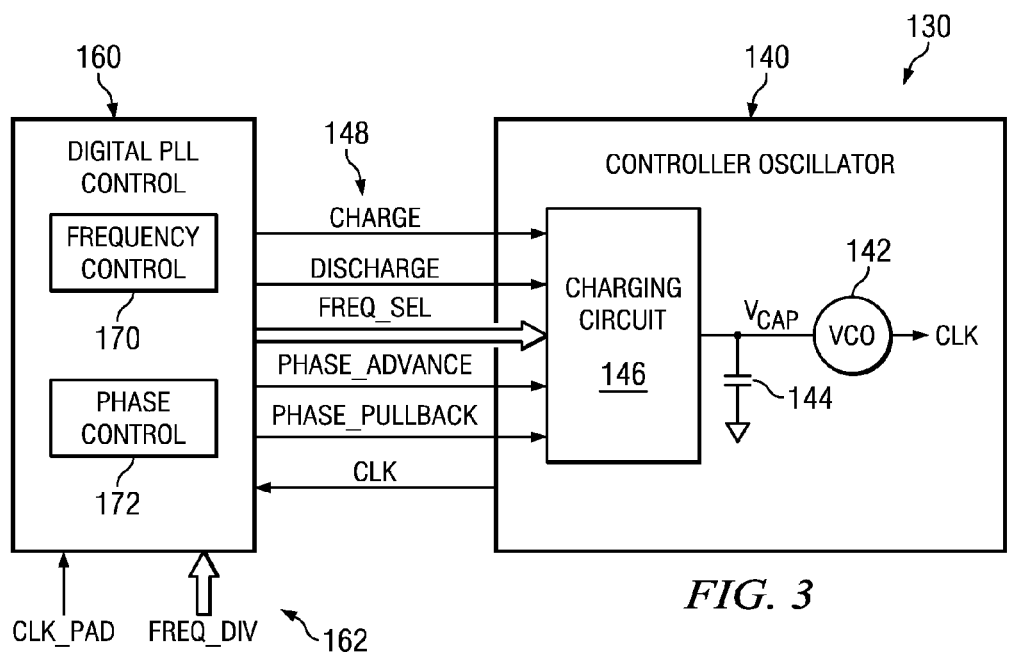
FIG. 3 is a block diagram of the clock recovery circuit.

Reference is now made to FIG. 3 which illustrates a block diagram of the clock recovery circuit 130. The clock recovery circuit 130 includes a controlled oscillator circuit 140. The controlled oscillator circuit 140 includes a voltage controlled oscillator 142 that outputs the generated clock signal CLK. The frequency of the clock signal CLK generated and output by the voltage controlled oscillator (VCO) 142 is set as a function of a control voltage Vcap received at an input of the voltage controlled oscillator 142. The control voltage Vcap is the voltage across a capacitor 144 coupled between the input of the voltage controlled oscillator 142 and a reference voltage (for example, ground). The control voltage Vcap is set by charging circuitry 146 coupled to the capacitor 144. The charging circuitry 146 operates responsive to a set of control signals 148 to source charge to the capacitor 144 and drain charge from the capacitor 144, thus setting the control voltage Vcap output from the capacitor 144 as a function of that sourced/drained charge.

One of the control signals 148 is a charge signal (CHARGE). The CHARGE signal controls actuation of a current source within the charging circuit 146 to source charge to the capacitor 144. Another one of the control signals 148 is a discharge signal (DISCHARGE). The DISCHARGE signal controls actuation of a current source within the charging circuit 146 to drain charge from the capacitor 144. The CHARGE and DISCHARGE signals, along with their associated current sources, and in absence of any other sourced/drained charge, set Vcap=Vfr and thus define the free-running frequency of the generated clock signal CLK.

A set of control signals 148 comprise frequency selection (FREQ_SEL) signals for the controlled oscillator 140. The FREQ_SEL signals control actuation of a corresponding plurality of current sources within the charging circuit 146 to source charge to (and perhaps drain charge from) the capacitor 144. The FREQ_SEL signals, along with their associated current sources, adjust the value of control voltage Vcap=Vo (different from Vfr) so as to set the operating frequency of the generated clock signal CLK. A change in the FREQ_SEL signals thus effectuates a change in the control voltage Vcap which produces variation in the frequency of the clock signal CLK.

Yet another one of the control signals 148 comprises a phase advance signal (PHASE_ADVANCE). The PHASE_ADVANCE signal controls actuation of a current source within the charging circuit 146 to source charge to the capacitor 144. More specifically, the PHASE_ADVANCE signal causes its current source to momentarily adjust the value of control voltage Vcap>Vo (for example, for one cycle of a CLK period) by sourcing charge to the capacitor 144 so as to provide a momentary increase in the operating frequency of the generated clock signal CLK for the purpose of shifting its phase.

A final one of the control signals 148 comprises a phase pullback signal (PHASE_PULLBACK). The PHASE_PULLBACK signal controls actuation of a current source within the charging circuit 146 to drain charge from the capacitor 144. More specifically, the PHASE_PULLBACK signal causes its current source to momentarily adjust the value of control voltage Vcap<Vo (for example, for one cycle of a CLK period) by draining charge from the capacitor 144 so as to provide a momentary decrease in the operating frequency of the generated clock signal CLK for the purpose of shifting its phase.

The clock recovery circuit 130 further includes a digital phase-lock-loop (PLL) control circuit 160 which generates the control signals 148. The digital PLL control circuit 160 operates responsive to a set of signals 162. One of the signals 162 is the generated clock signal CLK (or signals derived from or related to the clock signal CLK) output from the controlled oscillator circuit 140. Another of the signals is the clock signal CLK_PAD supplied by the transmitter 112. The digital PLL control circuit 160 further receives a set of frequency divide signals (FREQ_DIV) as part of the signals 162. The FREQ_DIV signals provide a numerical divisor whose value specifies a frequency ratio between the clock signal CLK_PAD supplied by the transmitter 112 and the generated clock signal CLK output from the controlled oscillator circuit 140.

The digital PLL control circuit 160 includes a frequency control functionality 170 and a phase control functionality 172.

The frequency control functionality 170 performs a check of the operating frequency of the generated clock signal CLK. This check includes an operation to count the number of CLK cycles within one CLK_PAD period. The goal is for the number of CLK cycles within one CLK_PAD period to equal the value of the numerical divisor provided by the FREQ_DIV signals. If the counted number does not match the value of the numerical divisor, then the frequency of the generated clock signal CLK is incorrect and the frequency control functionality 170 will change the value of the FREQ_SEL signals output from the digital PLL control circuit 160 and applied to the controlled oscillator circuit 140.

Figure 4:
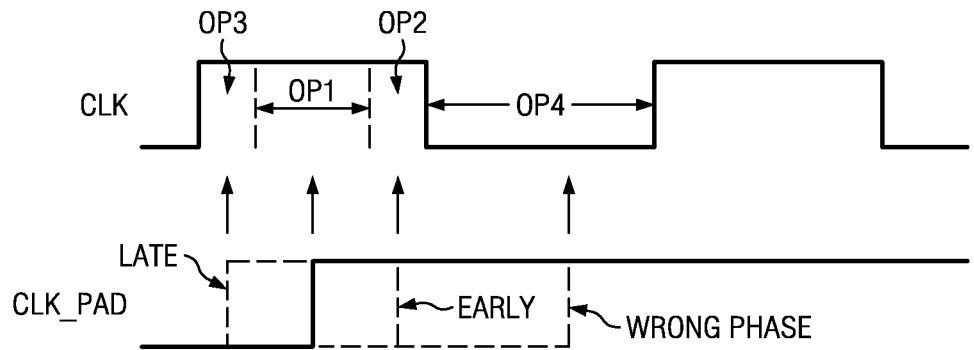
FIG. 4 illustrates divisional of the clock signal period into multiple parts.

In evaluating the generated clock signal CLK, each CLK period is divided by the digital PLL control 160 into four parts referred to operating points (OP): OP1, OP2, OP3 and OP4 as shown in FIG. 4. Preferably, these operating points are non-overlapping. The part OP1 is generally the center portion of the positive pulse (or first half) of the CLK period. The part OP2 is generally a portion of the positive pulse of the CLK period between the part OP1 and a trailing edge of the positive pulse. The part OP3 is generally a portion of the positive pulse of the CLK period between a leading edge of the positive pulse and the part OP1. The part OP4 is the negative pulse (or second half) of the CLK period.

FIG. 4 further illustrates an exemplary timing relationship between the generated clock signal CLK and the clock signal CLK_PAD. The operation to change the value of the FREQ_SEL signals output from the digital PLL control circuit 160 is performed by the frequency control functionality 170 only when the leading (or trailing) edges of the clock signal CLK_PAD fall within the part OP1 of the generated clock signal CLK. To ensure accuracy, the operation to count the number of CLK cycles within one CLK_PAD period is performed twice: once with respect to the leading (positive) edges of the generated clock signal CLK; and once with respect to the trailing (negative) edges of the generated clock signal CLK. Only if the counts are made when both the leading (or trailing) edges of the clock signal CLK_PAD fall within the part OP1 of the generated clock signal CLK can it be ensured that the counts are accurate and can be used to drive any necessary frequency adjustment through a change in the value of the FREQ_SEL signals.

Figure 5:
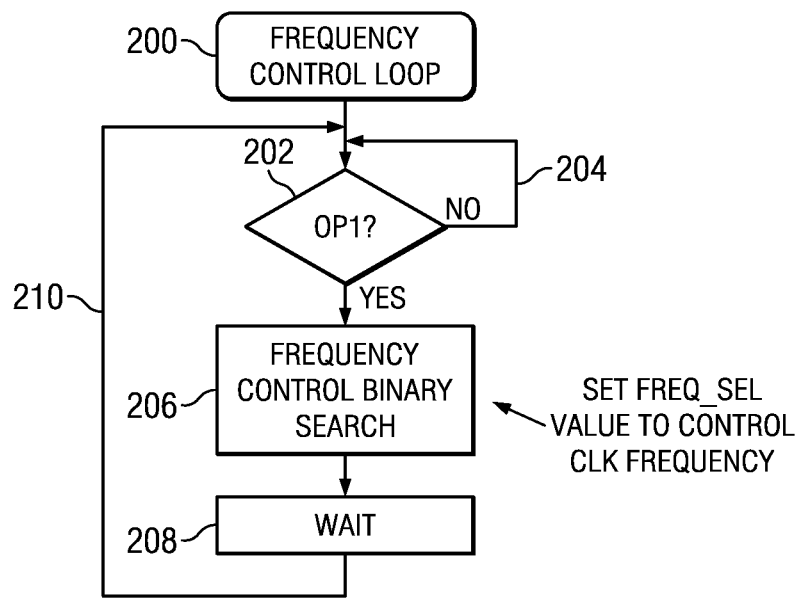
FIG. 5 is a flow diagram for a frequency control loop implemented by frequency control functionality.

FIG. 5 provides a flow diagram for a frequency control loop 200 implemented by the frequency control functionality 170. The loop 200 tests at step 202 whether the leading (or trailing) edges of the clock signal CLK_PAD fall within the part OP1 of the generated clock signal CLK. If not, the process returns 204 to step 202 and checks again. When the test in step 202 is satisfied, the loop 200 implements a frequency control algorithm 206. The algorithm 206 preferably makes use of a binary search to speed up the frequency tracking operation, but this binary search is optional and instead a more simple algorithm implementing an increment/decrement operation could be used. The algorithm 206 controls the selection of the frequency of the generated clock signal CLK by: a) counting the number of CLK cycles within one CLK_PAD period; b) comparing the count to the value of the numerical divisor provided by the FREQ_DIV signals; and setting the value of the FREQ_SEL signals in response to that comparison. In this case, setting may comprise changing or not changing the previously set value of the FREQ_SEL signals as necessary in accordance with the result of the count and comparison. The loop 200 then enters a wait or delay mode 208 before returning 210 to step 202 and check again.

The phase control functionality 172 performs a check of the operating point of the generated clock signal CLK. It will be recalled that the preference is for either the leading edge or trailing edge of the clock signal CLK_PAD to fall within the part OP1 of the generated clock signal CLK. The check performed by the phase control functionality 172 accordingly includes an operation to determine the locations of the leading (or trailing) edges of the clock signal CLK_PAD relative to the operating points (OP) of the CLK period.

Reference is once again made to FIG. 4. To the extent the rising edge of the clock signal CLK_PAD falls within the OP2 part of the CLK period, this is indicative of the phase of the generated clock signal CLK being early and a phase pullback operation is instigated by asserting the PHASE_PULLBACK signal to temporarily (for example, for one CLK period) slow down the clock signal CLK and bring its phase back into alignment with the OP1 part. Conversely, to the extent the rising edge of the clock signal CLK_PAD falls within the OP3 part of the CLK period, this is indicative of the phase of the generated clock signal CLK being late and a phase advance operation is instigated by asserting the PHASE_ADVANCE signal to temporarily (for example, for one CLK period) speed up the clock signal CLK and bring its phase back into alignment with the OP1 part. Lastly, to the extent the rising edge of the clock signal CLK_PAD falls within the OP4 part of the CLK period, this is indicative of the phase of the generated clock signal CLK being out of phase (or in the wrong phase) and a phase change (advance or pullback) operation is instigated (using the PHASE_ADVANCE signal or PHASE_PULLBACK signal) over an extended period of time (for example, over multiple CLK periods) to change the frequency of the clock signal CLK and bring its phase back into alignment with the OP1 part.

Figure 6:
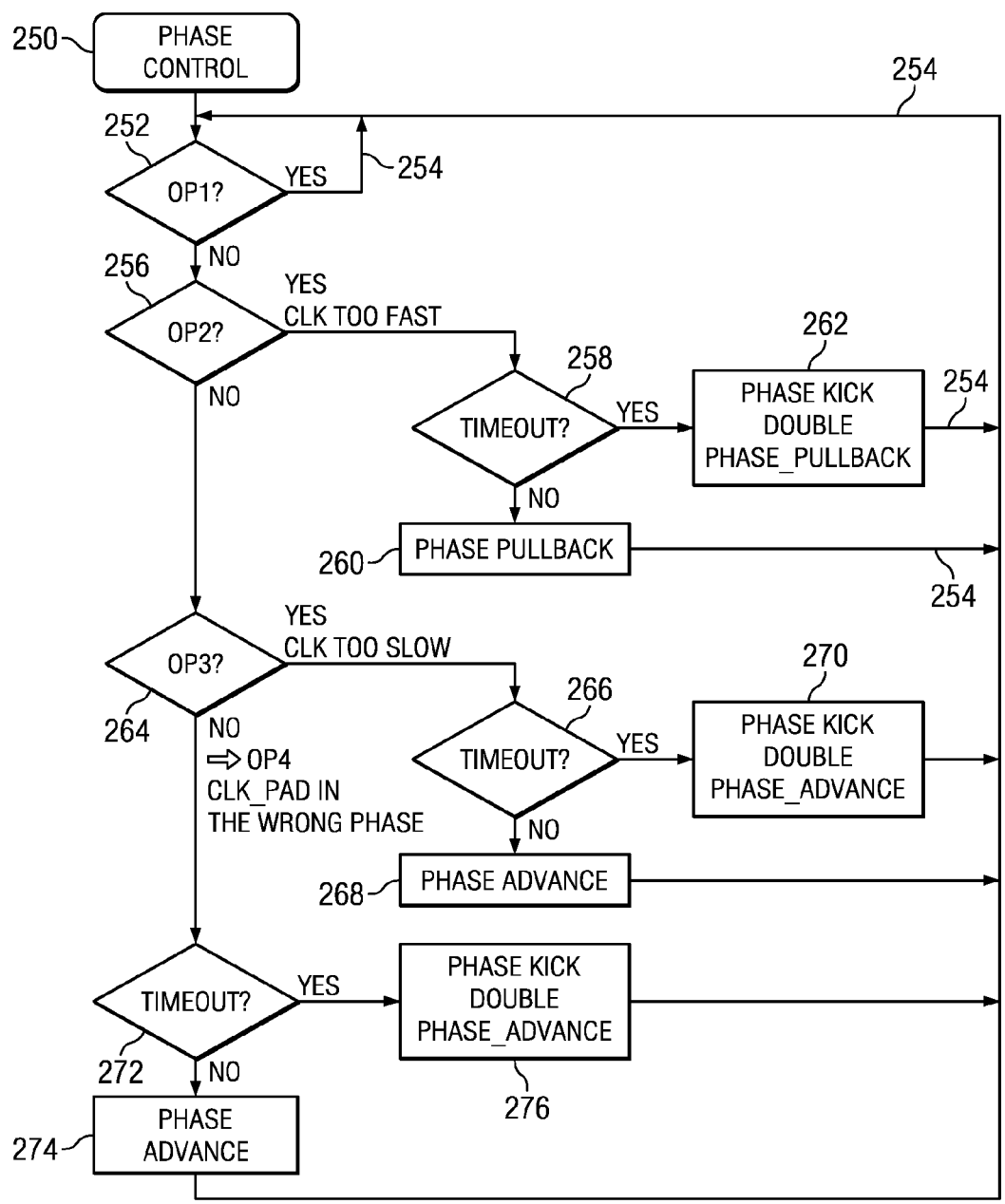
FIG. 6 is a flow diagram for a phase control loop implemented by phase control functionality.

FIG. 6 provides a flow diagram for a phase control loop 250 implemented by the phase control functionality 172. The loop 250 tests at step 252 whether the leading (or trailing) edges of the clock signal CLK_PAD fall within the part OP1 of the generated clock signal CLK. If so, the process returns 254 to step 252 and checks again. It is preferred that either the leading edge or trailing edge of the clock signal CLK_PAD fall within the part OP1, and the remainder of the phase control loop 250 concerns the operations taken to bring the leading (or trailing) edges of the clock signal CLK_PAD within the part OP1.

If no in step 252, then the loop 250 tests at step 256 whether the leading (or trailing) edges of the clock signal CLK_PAD fall within the part OP2 of the generated clock signal CLK. If so, this indicates that the phase of the clock is early, and perhaps that the clock signal CLK is running too fast. A phase pullback operation is then performed.

There are two types of phase pullback supported by the loop 250. A timeout test is performed at step 258 to determine the cumulative amount of time the leading (or trailing) edges of the clock signal CLK_PAD are detected within the part OP2 without successfully moving to part OP1. If the cumulative time does not exceed a threshold for OP2, then a single phase pullback operation 260 is instigated by asserting the PHASE_PULLBACK signal to temporarily (for example, for one CLK period) slow down the clock signal CLK and bring its phase back into alignment with the OP1 part. Conversely, if the cumulative time exceeds the threshold for OP2, then a double phase pullback operation 262 is instigated by asserting the PHASE_PULLBACK signal to temporarily (for example, for two or more CLK periods) slow down the clock signal CLK and bring its phase back into alignment with the OP1 part. The loop 250 then returns 254 to step 252 and checks again.

If no in step 256, then the loop 250 tests at step 264 whether the leading (or trailing) edges of the clock signal CLK_PAD fall within the part OP3 of the generated clock signal CLK. If so, this indicates that the phase of the clock is late, and perhaps that the clock signal CLK is running too slow. A phase advance operation is then performed.

There are two types of phase advance supported by the loop 250. A timeout test is performed at step 266 to determine the cumulative amount of time the leading (or trailing) edges of the clock signal CLK_PAD are detected within the part OP3 without successfully moving to part OP1. If the cumulative time does not exceed a threshold for OP3, then a single phase advance operation 268 is instigated by asserting the PHASE_ADVANCE signal to temporarily (for example, for one CLK period) speed up the clock signal CLK and bring its phase back into alignment with the OP1 part. Conversely, if the cumulative time exceeds the threshold for OP3, then a double phase advance operation 270 is instigated by asserting the PHASE_ADVANCE signal to temporarily (for example, for two or more CLK periods) speed up the clock signal CLK and bring its phase back into alignment with the OP1 part. The loop 250 then returns 254 to step 252 and checks again.

If no in step 264, then the leading (or trailing) edges of the clock signal CLK_PAD must fall within the part OP4 of the generated clock signal CLK, and thus the clock signal CLK_PAD is out of phase (or in the wrong phase), and perhaps the clock signal CLK frequency is not correctly set. A phase change operation is then performed.

There are two types of phase advance supported by the loop 250. A timeout test is performed at step 272 to determine the cumulative amount of time the leading (or trailing) edges of the clock signal CLK_PAD are detected within the part OP4 without successfully moving to part OP1 (or parts OP2 or OP3). If the cumulative time does not exceed a threshold for OP4, then a single phase advance operation 274 is instigated by asserting the PHASE_ADVANCE signal to temporarily (for example, for one CLK period) speed up the clock signal CLK and bring its phase back into alignment with the OP1 part (or parts OP2 or OP3). Conversely, if the cumulative time exceeds the threshold for OP4, then a double phase advance operation 276 is instigated by asserting the PHASE_ADVANCE signal to temporarily (for example, for two or more CLK periods) speed up the clock signal CLK and bring its phase back into alignment with the OP1 part (or parts OP2 or OP3). The loop 250 then returns 254 to step 252 and checks again.

Although the phase change associated with the OP4 comparison is described above as using a phase advance operation, it will be understood that a phase pullback operation could alternatively be used.

The digital PLL control circuit 160 operates in two modes: a calibration mode and a locked mode. The calibration mode comprises a controlled interleaving of the frequency control functionality 170 and the phase control functionality 172. In calibration mode, a frequency binary search is preferably used to reduce the number of search steps associated with selecting a frequency (but it will be understood that a simple increment/decrement operation could instead be used). The frequency is calibrated using both edges of the CLK period so as to reduce the frequency count accuracy to half of the CLK period. Further accuracy can be achieved counting the number of CLK periods within a larger number of CLK_PAD cycles. The calibration mode still further uses the phase control which implements a phase look-ahead type process so as to minimize the phase jitter. To effectuate this jitter minimization, the division point between OP1 and OP2 and the division point between OP1 and OP3 are set, for example, in a fixed relationship, at or slightly less than one-quarter of the CLK period. With this setting, the CLK_PAD jitter must also be at or less than one-quarter of the CLK period. In calibration mode, testing as to each of the operating points OP1, OP2, OP3 and OP4 is permitted. In locked mode, however, only the operating points OP1, OP2 and OP3 are evaluated.

Figure 7:
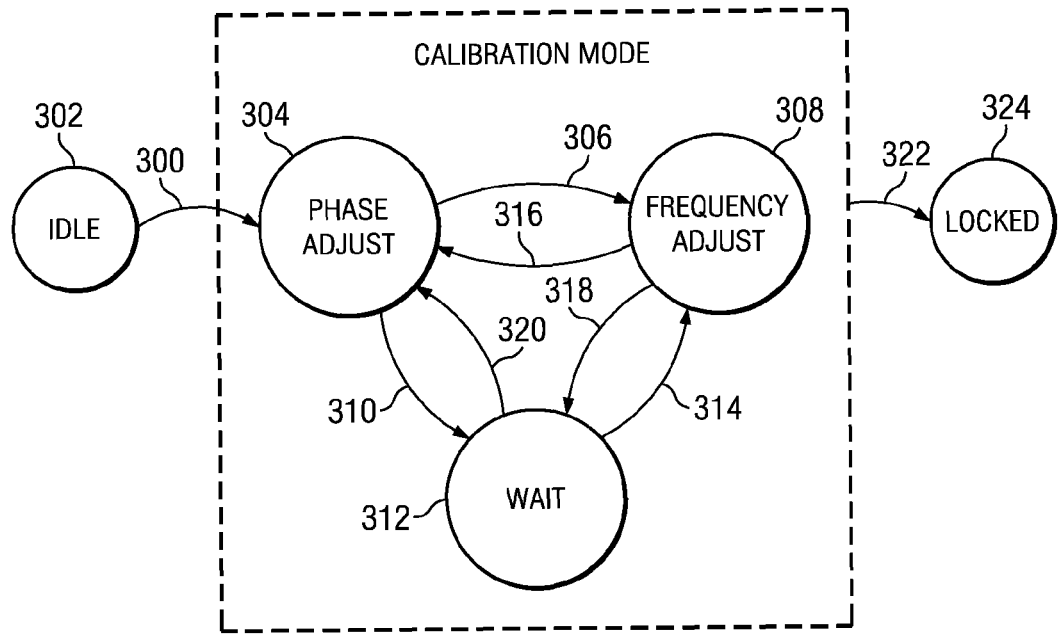
FIG. 7 illustrates a state diagram for operation of a calibration mode and locked mode.

Reference is now made to FIG. 7 which illustrates a state diagram for operation of the calibration mode and locked mode. The calibration mode is entered by a start signal 300 from an idle state 302. Responsive to signal 300, the calibration mode enters a phase adjustment state 304. This phase adjustment state 304, as described above in connection with the phase control functionality 172 and implementation of the phase control loop 250, performs a check of the operating point of the generated clock signal CLK (relative to the parts OP1, OP2, OP3 and OP4) and initiates phase advance operations or phase pullback operations as needed. If no phase change is made, the calibration mode moves 306 to the frequency adjustment state 308. Conversely, to the extent a phase change is made (by assertion of either the PHASE_ADVANCE signal or the PHASE_PULLBACK signal), a move 310 is made in the calibration mode to enter a wait state 312. This wait state 312 introduces process delay used to avoid chattering after any operational adjustment, such as a phase adjustment, is made. After the delay expires, the calibration mode checks if the signal is in OP1 and then moves 314 to the frequency adjustment state 308. If not in OP1, the process returns 320 to the phase adjustment state 304. This frequency adjustment state 308, as described above in connection with the frequency control functionality 170 and implementation of the frequency control loop 200, performs a check on the operating frequency of the generated clock signal CLK by comparing a count of the number of CLK cycles within one CLK_PAD period to the numerical divisor provided by the FREQ_DIV signals and initiating a frequency change as needed. If no phase change is made, the calibration mode moves 316 back to the phase adjustment state 304. To the extent a frequency change is made (by changing the value of the FREQ_SEL signals), the calibration mode enters 318 the wait state 312. This wait state 312 introduces process delay used to avoid chattering after any operational adjustment, such as a frequency adjustment, is made. After the delay expires, the calibration mode moves 320 back to the phase adjustment state 304.

It will accordingly be noted that the calibration mode implements an interleaved phase and frequency adjustment technique. The calibration mode may bounce back and forth in this interleaved operation between the phase adjustment state 304 and frequency adjustment state 308 for a fixed number of times before exiting the calibration mode, or alternatively may bounce back and forth in this interleaved operation between the phase adjustment state 304 and frequency adjustment state 308 until a certain condition is met concerning phase and frequency setting (such as, for example, the calibration mode passes consecutively through the phase adjustment state 304 and frequency adjustment state 308 without making any phase or frequency change).

Upon exiting 322 the calibration mode, movement is made to the locked mode with locked state 324. The locked state 324 implements a modified version of phase adjustment, as described above in connection with the phase control functionality 172 and implementation of the phase control loop 250, by performing a check of the operating point of the generated clock signal CLK (relative to the parts OP1, OP2 and OP3) and initiating phase advance operations or phase pullback operations as needed. As discussed above, there is no evaluation made in the locked mode 324 with respect to the part OP4. To the extent a phase change is needed, the locked mode 324 supports an assertion of either the PHASE_ADVANCE signal or the PHASE_PULLBACK signal. The phase adjustment operation performed in the locked mode 324 may be viewed as a fine tuning of phase with respect to the signal CLK at the previously locked frequency.

Figure 8:
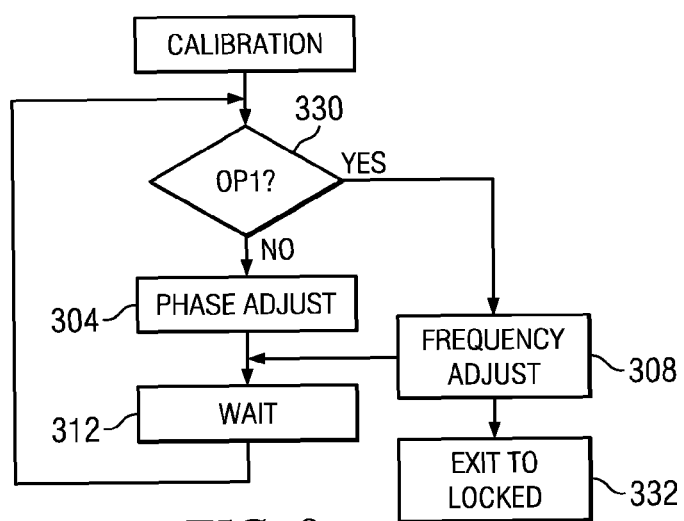
FIG. 8 is flow diagram illustration calibration mode operation.

The controlled interleaving of the frequency control functionality 170 and the phase control functionality 172 as performed by the calibration mode is illustrated in flow diagram format in FIG. 8. The process tests at step 330 whether the leading (or trailing) edges of the clock signal CLK_PAD fall within the part OP1 of the generated clock signal CLK. If no, this indicates an out of phase condition and the process enters the phase adjustment state 304 as described above. Following completion of a phase adjustment (advance or pullback), the process enters the wait state 312 and then returns to step 330. If step 330 indicates that the leading (or trailing) edges of the clock signal CLK_PAD fall within the part OP1 of the generated clock signal CLK, the process enters the frequency adjustment state 308 as described above. To the extent a frequency adjustment is performed, the process enters the wait state 312 and then returns to step 330. If no frequency adjustment is performed, the process exits 332 to the locked state.

The frequency control algorithm 206 of the frequency control loop 200 performs a check on the operating frequency of the generated clock signal CLK by comparing a count of the number of CLK cycles within one CLK_PAD period to the numerical divisor provided by the FREQ_DIV signals. More specifically, the algorithm 206 performs this count with respect to both the rising and falling edges of the clock signal CLK to produce two count values (COUNTN and COUNTP). If both COUNTN and COUNTP are less than the FREQ_DIV value, then the VCO is operating too slowly (the clock signal CLK is slow) and the FREQ_SEL value is increased (for example, by incrementing by one step or executing the binary search). Conversely, if both COUNTN and COUNTP are more than the FREQ_DIV value, then the VCO is operating too quickly (the clock signal CLK is fast) and the FREQ_SEL value is decreased (for example, by decrementing by one step or implementing the binary search). Before making another frequency check after a frequency change, it is important to again achieve phase alignment by executing the phase control loop. When both COUNTN and COUNTP equal the FREQ_DIV value, then the VCO is operating at the correct frequency and the frequency may be locked and the frequency tracking process terminated in favor of continued phase observation in the locked mode.

It will be noted that an initial frequency of the clock signal CLK (during a first pass through the frequency control process) could be significantly offset from the desired frequency. The process described above for implementing a one step increment or decrement of the FREQ_SEL value may take too long to achieve frequency lock. The frequency control algorithm 206 accordingly supports the use of a binary search algorithm with respect to controlling the selection of the FREQ_SEL value when COUNTN and COUNTP are determined to differ from the FREQ_DIV value. Binary search algorithms are well known to those skilled in the art. As an example of the search implementation, the magnitude of the increment or decrement of the FREQ_SEL value is made as a power of 2 that decreases with each successive frequency adjustment. So, a first adjustment may comprise an increment or decrement of the FREQ_SEL value by 8 ($2^3$), while a second adjustment may comprise an increment or decrement of the FREQ_SEL value by 4 ($2^2$), then a third adjustment may comprise an increment or decrement of the FREQ_SEL value by 2 ($2^1$), and a final adjustment may comprise an increment or decrement of the FREQ_SEL value by 1 ($2^0$).

Figure 9:
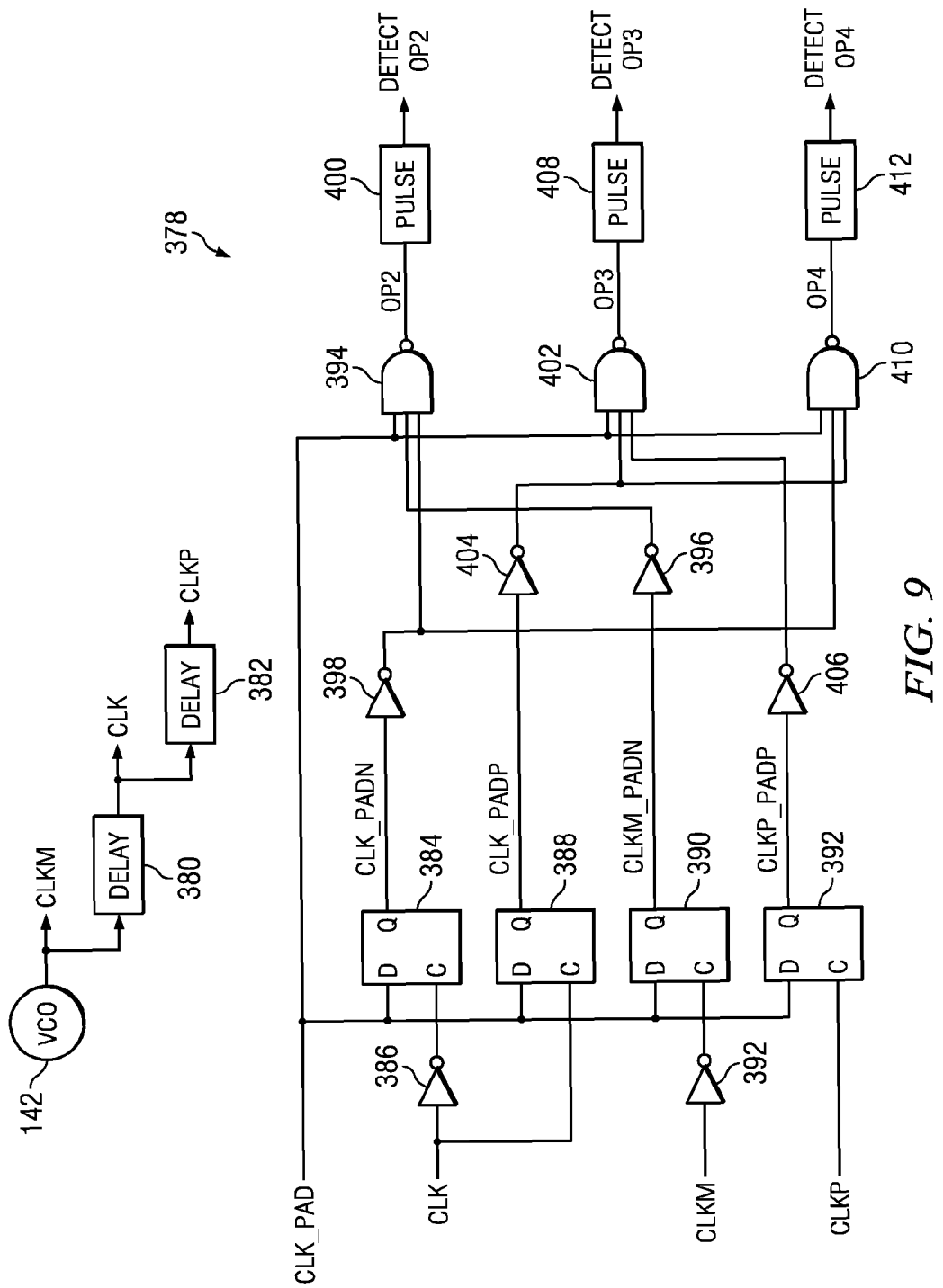
FIG. 9 is a block diagram of a logic circuit operable to detect relative position between two clock signals.

Reference is now made to FIG. 9 which illustrates a logic circuit 378 that will logically combine the clock signal CLK and clock signal CLK_PAD to determine whether the leading (or trailing) edges of the clock signal CLK_PAD fall within parts OP1, OP2, OP3 and OP4 of the generated clock signal CLK. In this implementation, the clock signal CLK is obtained from the VCO 142 after processing through a first delay 380. Thus, the output of the VCO 142 is a signal CLKM. The clock signal CLK is processed through a second delay 382 to produce a signal CLKP. Thus, signals CLKM and CLKP have the same frequency, but differing phases (with CLKM ahead of CLK and CLKP behind CLK). It will be understood that other circuitry than that illustrated in FIG. 9 could be used to generate the signals CLKM and CLKP having the described phase relationship with respect to the clock signal CLK.

A first D-type latch 384 receives the clock signal CLK_PAD at its data (D) input and an inverted 386 clock signal CLK at its clock (C) input. The first D-type latch 384 outputs a signal CLK_PADN which is the clock signal CLK_PAD latched by the negative edge of the clock signal CLK.

A second D-type latch 388 receives the clock signal CLK_PAD at its data (D) input and the clock signal CLK at its clock (C) input. The second D-type latch 388 outputs a signal CLK_PADP which is the clock signal CLK_PAD latched by the positive edge of the clock signal CLK.

A third D-type latch 390 receives the clock signal CLK_PAD at its data (D) input and an inverted 392 signal CLKM at its clock (C) input. The third D-type latch 390 outputs a signal CLKM_PADN which is the clock signal CLK_PAD latched by the negative edge of the signal CLKM.

A fourth D-type latch 392 receives the clock signal CLK_PAD at its data (D) input and the signal CLKP at its clock (C) input. The fourth D-type latch 392 outputs a signal CLKP_PADP which is the clock signal CLK_PAD latched by the positive edge of the clock signal CLKP.

A first NAND gate 394 receives the clock signal CLK_PAD at its first input, an inverted 396 signal CLKM_PADN at its second input, and an inverted 398 signal CLK_PADN at its third input. The first NAND gate 394 outputs a signal OP2 which is indicative of the leading (or trailing) edges of the clock signal CLK_PAD falling within part OP2 of the generated clock signal CLK. A pulse generator 400 outputs a pulsed signal DETECT OP2 in response to the signal OP2.

A second NAND gate 402 receives the clock signal CLK_PAD at its first input, an inverted 404 signal CLK_PADP at its second input, and an inverted 406 signal CLKP_PADP at its third input. The second NAND gate 402 outputs a signal OP3 which is indicative of the leading (or trailing) edges of the clock signal CLK_PAD falling within part OP3 of the generated clock signal CLK. A pulse generator 408 outputs a pulsed signal DETECT OP3 in response to the signal OP3.

A third NAND gate 410 receives the clock signal CLK_PAD at its first input, an inverted 398 signal CLK_PADN at its second input, and an inverted 404 signal CLK_PADP at its third input. The third NAND gate 410 outputs a signal OP4 which is indicative of the leading (or trailing) edges of the clock signal CLK_PAD falling within part OP4 of the generated clock signal CLK. A pulse generator 412 outputs a pulsed signal DETECT OP4 in response to the signal OP4.

Figure 10A:
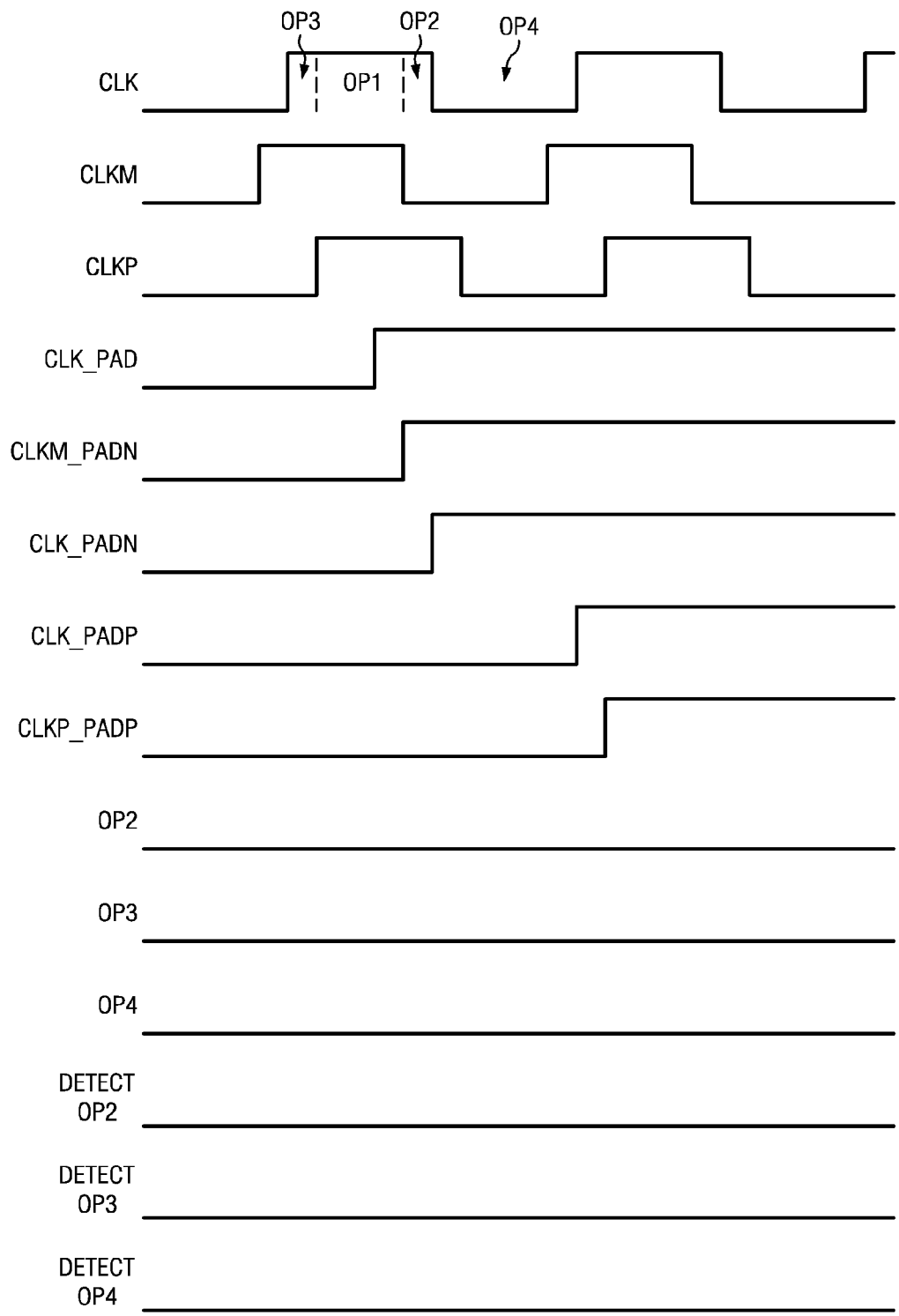
FIGS. 10A-10D are timing diagrams illustration operation of the logic circuit of FIG. 9.

Operation of the logic circuit 378 to make a detection of the leading (or trailing) edges of the clock signal CLK_PAD falling within part OP1 of the generated clock signal CLK is shown in FIG. 10A. It will be noted that detection within part OP1 is indicated when there is no change in the signal DETECT OP2, signal DETECT OP3 or signal DETECT OP4. This indicates phase alignment as discussed above, and the OP1 detection can be used to trigger movement from the phase adjustment state 304 to the frequency adjustment state 308 during calibration mode.

Figure 10B:
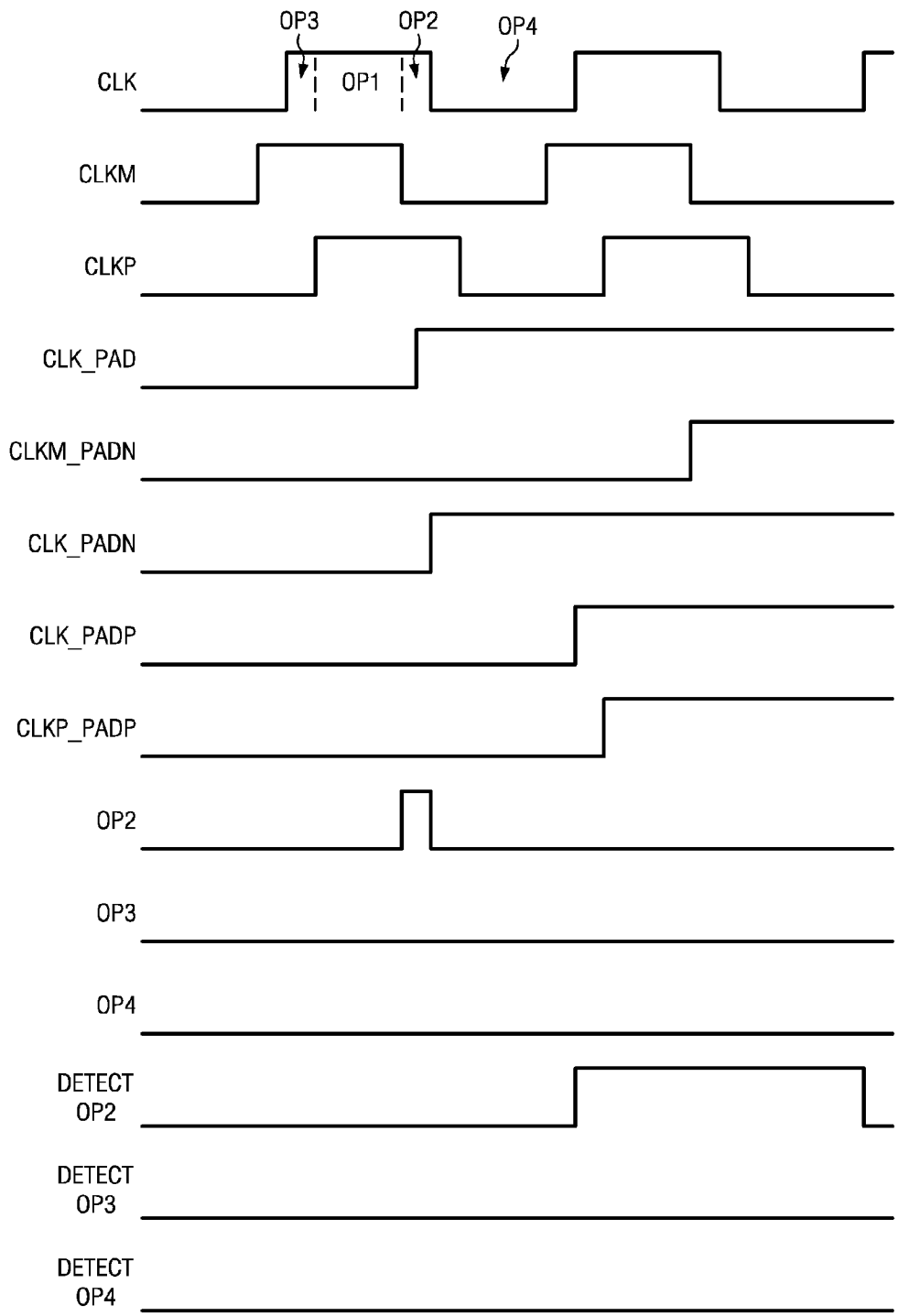

Operation of the logic circuit 378 to make a detection of the leading (or trailing) edges of the clock signal CLK_PAD falling within part OP2 of the generated clock signal CLK is shown in FIG. 10B. Output of the pulsed signal DETECT OP2 indicates detection within part OP2. This indicates that the phase of the clock signal CLK is early and that perhaps the clock frequency is too fast. The OP2 detection can be used to trigger the PHASE_PULLBACK signal to effectuate a phase adjustment in either the phase adjustment state 308 during calibration mode or the locked state 324 in the locked mode. For example, the PHASE_PULLBACK signal may be activated for the duration of one clock period of the clock signal CLK to momentarily decrease the frequency of the clock signal CLK and move the leading (or trailing) edges of the clock signal CLK_PAD towards, and preferably within, the part OP1.

Figure 10C:
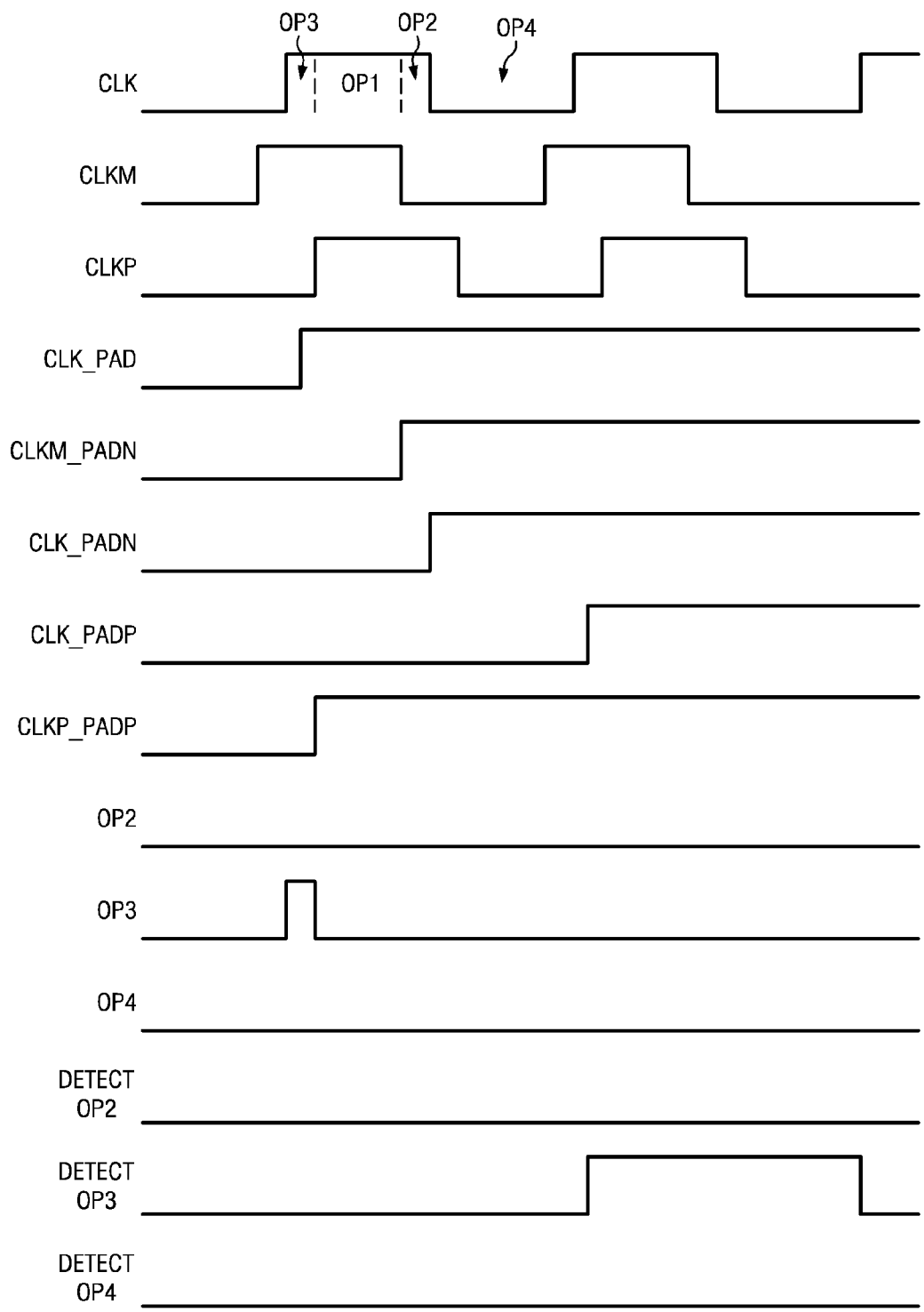

Operation of the logic circuit 378 to make a detection of the leading (or trailing) edges of the clock signal CLK_PAD falling within part OP3 of the generated clock signal CLK is shown in FIG. 10C. Output of the pulsed signal DETECT OP3 indicates detection within part OP3. The OP3 detection can be used to trigger the PHASE_ADVANCE signal to effectuate a phase adjustment in either the phase adjustment state 308 during calibration mode or the locked state 324 in the locked mode. For example, the PHASE_ADVANCE signal may be activated for the duration of one clock period of the clock signal CLK to momentarily increase the frequency of the clock signal CLK and move the leading (or trailing) edges of the clock signal CLK_PAD towards, and preferably within, the part OP1.

Figure 10D:
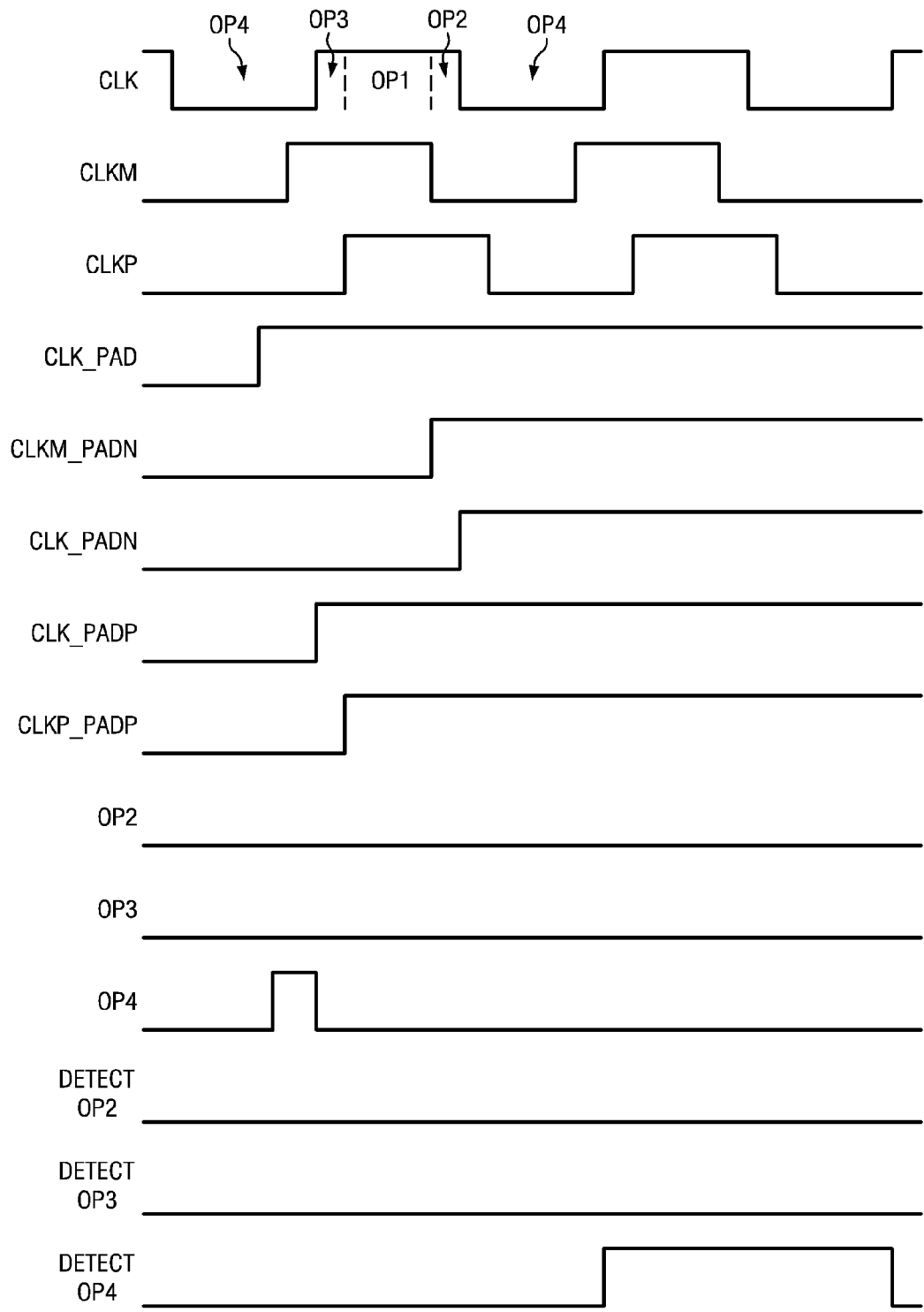

Operation of the logic circuit 378 to make a detection of the leading (or trailing) edges of the clock signal CLK_PAD falling within part OP4 of the generated clock signal CLK is shown in FIG. 10D. Output of the pulsed signal DETECT OP4 indicates detection within part OP4. The OP4 detection can be used to trigger the PHASE_ADVANCE signal to effectuate a phase adjustment in the phase adjustment state 308. There is no need to evaluate the detection of the part OP4 in while in the locked state 324 of the locked mode. For example, the PHASE_ADVANCE signal may be activated for the duration of one or more clock periods of the clock signal CLK to momentarily increase the frequency of the clock signal CLK and move the leading (or trailing) edges of the clock signal CLK_PAD towards, and preferably within, the part OP1.

Again, although the part OP4 action described above involves a phase adjustment using the PHASE_ADVANCE signal, it will be understood that alternatively the phase adjustment could use the PHASE_PULLBACK signal.

In an alternative embodiment, the digital PLL control circuit 160 operates in three modes: a fast calibration mode, a fine calibration mode and a locked mode. Each of the two calibration modes comprises a controlled interleaving of the frequency control functionality 170 and the phase control functionality 172. In the fast calibration mode, a frequency binary search is used to reduce the number of search steps associated with a course selection of the clock frequency. In the fine calibration mode, a single step search is used to fine tune the clock frequency. In both calibration modes, the frequency is calibrated using both edges of the CLK period so as to reduce the frequency count accuracy to half of the CLK period. In the fast calibration mode, account is made of the number of CLK periods within a single CLK_PAD cycle. In the fine calibration mode, however, further accuracy is achieved by counting the number of CLK periods within a larger number of CLK_PAD cycles. Each calibration mode still further uses the phase control which implements a phase look-ahead type process so as to minimize the phase jitter. To effectuate this jitter minimization, the division point between OP1 and OP2 and the division point between OP1 and OP3 are set at or slightly less than one-quarter of the CLK period. With this setting, the CLK_PAD jitter must also be at or less than one-quarter of the CLK period. In either calibration mode, testing as to each of the operating points OP1, OP2, OP3 and OP4 is permitted. In locked mode, however, only the operating points OP1, OP2 and OP3 are evaluated.

Figure 11:
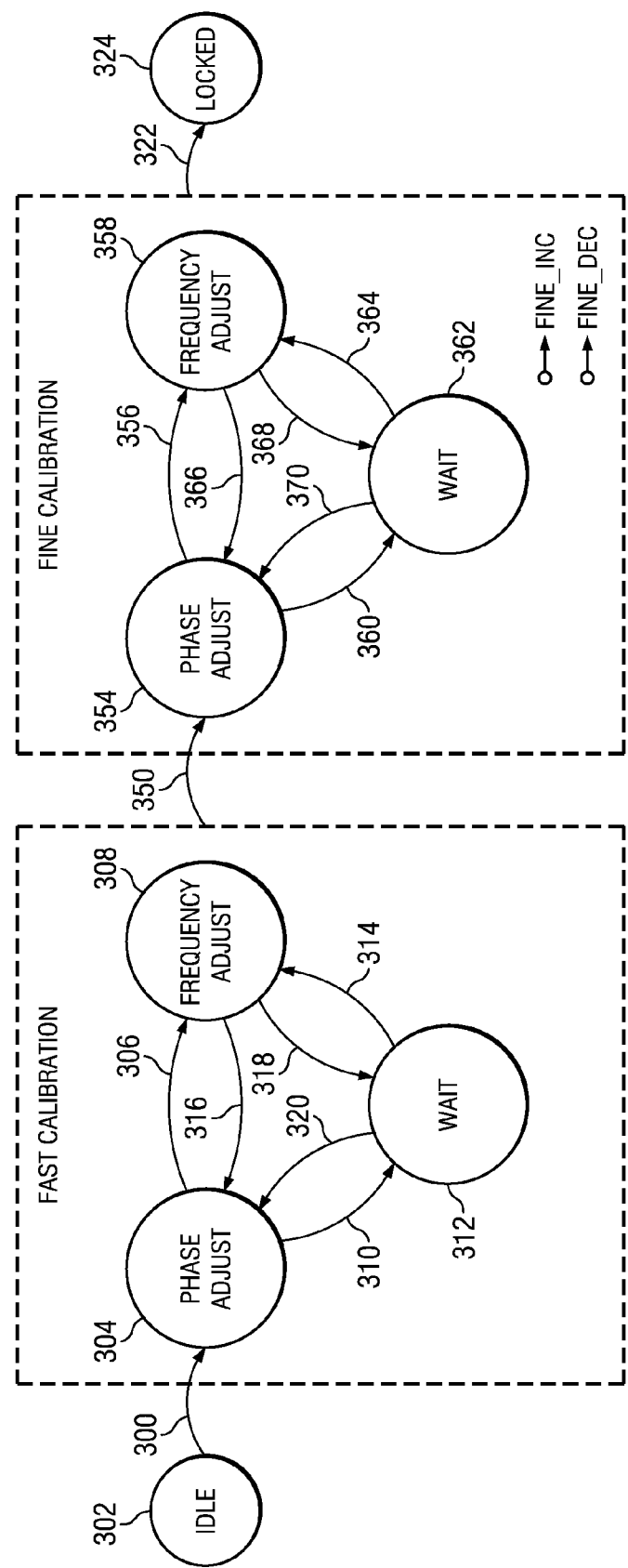
FIG. 11 illustrates a state diagram for operation of a fast calibration mode, fine calibration mode and locked mode.

Reference is now made to FIG. 11 which illustrates a state diagram for operation of the fast calibration mode, fine calibration mode and locked mode. The fast calibration mode is entered by a start signal 300 from an idle state 302. Responsive to signal 300, the fast calibration mode enters a phase adjustment state 304. This phase adjustment state 304, as described above in connection with the phase control functionality 172 and implementation of the phase control loop 250, performs a check of the operating point of the generated clock signal CLK (relative to the parts OP1, OP2, OP3 and OP4) and initiates phase advance operations or phase pullback operations as needed. If no phase change is made, the fast calibration mode moves 306 to the frequency adjustment state 308. Conversely, to the extent a phase change is made (by assertion of either the PHASE_ADVANCE signal or the PHASE_PULLBACK signal), a move 310 is made in the calibration mode to enter a wait state 312. This wait state 312 introduces process delay used to avoid chattering after any operational adjustment, such as a phase adjustment, is made. After the delay expires, the fast calibration mode moves checks that the signal is in OP1 and then moves 314 to the frequency adjustment state 308. If not in OP1, the process returns 320 to the phase adjust state. This frequency adjustment state 308, as described above in connection with the frequency control functionality 170 and implementation of the frequency control loop 200, performs a check on the operating frequency of the generated clock signal CLK by comparing a count of the number of CLK cycles within one CLK_PAD period to the numerical divisor provided by the FREQ_DIV signals and initiating a frequency change as needed. The frequency change operation utilizes the binary search technique described above. If no frequency change is made, the calibration mode moves 316 back to the phase adjustment state 304. To the extent a frequency change is made (by changing the value of the FREQ_SEL signals), the calibration mode enters 318 the wait state 312. This wait state 312 introduces a process delay used to avoid chattering after any operational adjustment, such as a frequency adjustment, is made. After the delay expires, the calibration mode moves 320 back to the phase adjustment state 304.

It will accordingly be noted that the fast calibration mode implements an interleaved phase and frequency adjustment technique. The fast calibration mode may bounce back and forth in an interleaved manner between the phase adjustment state 304 and frequency adjustment state 308 for a fixed number of times before exiting the fast calibration mode, or alternatively may bounce back and forth in an interleaved manner between the phase adjustment state 304 and frequency adjustment state 308 until a certain condition is met concerning phase and frequency setting (such as, for example, the fast calibration mode passes consecutively through the phase adjustment state 304 and frequency adjustment state 308 without making any phase or frequency change).

Upon exiting 350 the fast calibration mode, movement is made to the fine calibration mode. The fine calibration mode first enters a phase adjustment state 354. This phase adjustment state 354, as described above in connection with the phase control functionality 172 and implementation of the phase control loop 250, performs a check of the operating point of the generated clock signal CLK (relative to the parts OP1, OP2, OP3 and OP4) and initiates phase advance operations or phase pullback operations as needed. If no phase change is made, the fine calibration mode moves 356 to the frequency adjustment state 358. Conversely, to the extent a phase change is made (by assertion of either the PHASE_ADVANCE signal or the PHASE_PULLBACK signal), a move 360 is made in the calibration mode to enter a wait state 362. This wait state 362 introduces process delay used to avoid chattering after any operational adjustment, such as a phase adjustment, is made. After the delay expires, the fine calibration mode check if the signal is in OP1 and then moves 364 to the frequency adjustment state 358. If not in OP1, the process returns 370 to the phase adjustment state 354. This frequency adjustment state 358, as described above in connection with the frequency control functionality 170 and implementation of the frequency control loop 200, performs a check on the operating frequency of the generated clock signal CLK by comparing a count of the number of CLK cycles within several (for example, N, where N>1) CLK_PAD periods to the numerical divisor provided by the FREQ_DIV signals (multiplied by N) and initiating a frequency change as needed. The frequency change operation utilizes a single step adjustment technique. If no frequency change is made, the fine calibration mode moves 366 back to the phase adjustment state 354. To the extent a frequency change is made (by changing the value of the FREQ_SEL signals), the calibration mode enters 368 the wait state 362. This wait state 362 introduces a process delay used to avoid chattering after any operational adjustment, such as a frequency adjustment, is made. After the delay expires, the calibration mode moves 370 back to the phase adjustment state 354.

It will accordingly be noted that the fine calibration mode also implements an interleaved phase and frequency adjustment technique. The fine calibration mode may bounce back and forth in an interleaved manner between the phase adjustment state 354 and frequency adjustment state 358 for a fixed number of times before exiting the fine calibration mode, or alternatively may bounce back and forth in an interleaved manner between the phase adjustment state 354 and frequency adjustment state 358 until a certain condition is met concerning phase and frequency setting (such as, for example, the fine calibration mode passes consecutively through the phase adjustment state 354 and frequency adjustment state 358 without making any phase or frequency change).

Upon exiting 322 the fine calibration mode, movement is made to the locked mode with locked state 324. The locked state 324 implements a modified version of phase adjustment, as described above in connection with the phase control functionality 172 and implementation of the phase control loop 250, by performing a check of the operating point of the generated clock signal CLK (relative to the parts OP1, OP2 and OP3) and initiating phase advance operations or phase pullback operations as needed. As discussed above, there is no evaluation made in the locked mode 324 with respect to the part OP4. To the extent a phase change is needed, the locked mode 324 supports an assertion of either the PHASE_ADVANCE signal or the PHASE_PULLBACK signal. The phase adjustment operation performed in the locked mode 324 may be viewed a fine tuning of phase with respect to the signal CLK at the previously locked frequency.

Reference is once again made to FIG. 3. As discussed above, the FREQ_SEL signals are processed by the charging circuit 146 to select a certain voltage Vcap on the capacitor 144, with that voltage driving the output frequency of the signal CLK from the VCO 142. When making a frequency adjustment, the frequency control 170 selects the value of the FREQ_SEL signals. A change in the value of the FREQ_SEL signals plus/minus one is the fine tuning limit exercised over the setting of the output frequency of the signal CLK. Situations may arise, however, where the plus/minus one fine tuning limit is not satisfactory. A need would exist to provide some additional fractional control over frequency fine tuning. Such a need exists, for example, in connection with the operation of the fine calibration mode in FIG. 11.

Figure 12:
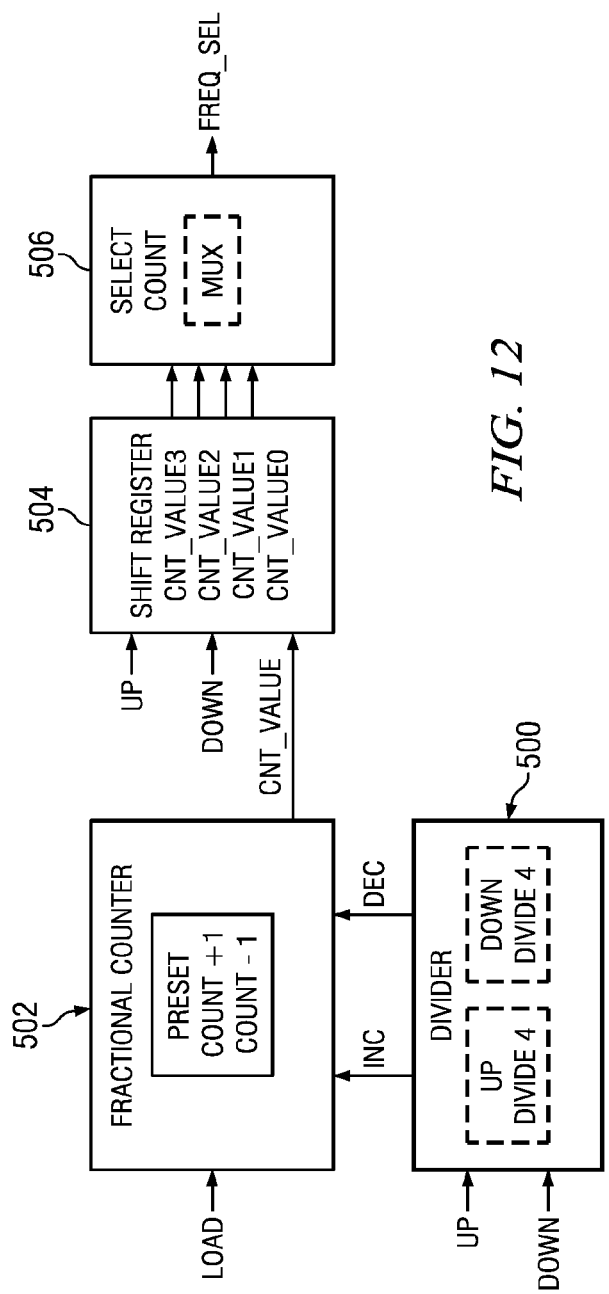
FIG. 12 is a block diagram of a fractional frequency control functionality.

Reference is now made to FIG. 12 which illustrates a block diagram of a fractional frequency control functionality within the frequency control 170. A divider circuit 500 receives a signal UP which is pulsed in response to a fine increment signal (FINE_INC), and a signal DOWN which is pulsed in response to a fine decrement (FINE_DEC) signal. These FINE_INC and FINE_DEC signals provide for fractional adjustment using the FREQ_SEL value. The divider circuit 500 performs a division (divide by P) and outputs an increment signal INC and a decrement signal DEC. The value of P defines a fractional level. For example, if P=4, then fractional steps of four (with four shift registers) are implemented. A fractional counter 502 receives both the increment signal INC and decrement signal DEC as well as a LOAD signal (used to load in initial value into the fractional counter 502). When the increment signal INC is asserted, a count value within the fractional counter 502 is incremented by one. When the decrement signal DEC is asserted, a count value within the fractional counter 502 is decremented by one. The fractional frequency control functionality further includes a shift register 504. The shift register 504 includes a plurality of register locations for storing count values. In response to assertion of either the signal UP or the signal DOWN, the shift register 504 loads the current count value (CNT_VALUE) from the fractional counter 502 into a first one of the register locations (CNT_VALUE0) and pushes previously loaded count values down to the other register locations (CNT_VALUE1 through CNT_VALUE3). A multiplexer 506 receives each of the count values from register locations CNT_VALUE0 through CNT_VALUE3 and selects one of the count values for output as the frequency select signal FREQ_SEL. More specifically, the multiplexer 506 is clocked by the signal CLK to select one of the count values from register locations CNT_VALUE0 through CNT_VALUE3 in a round robin (i.e., cyclical) manner. In this way, the frequency of the clock CLK, as set by the frequency select signal FREQ_SEL, can be fractionally controlled by the count values from register locations CNT_VALUE0 through CNT_VALUE3. To understand how this works, assume that register locations CNT_VALUE0 through CNT_VALUE3 store the following count values: 10, 10, 10, 11. Over the course of four clock CLK cycles, the multiplexer 506 will assert those count values: 10, 10, 10, 11 to the charging circuit 146 as the frequency select signal FREQ_SEL so as to control the current sources within the charging circuit 146 and set the voltage Vcap on the capacitor 144 at the input of the VCO 142. The capacitor 144 functions to average the voltages Vcap corresponding to the count values: 10, 10, 10, 11 and produce a fractional value of 10.25. The output frequency of the clock CLK can thus be fractionally set.

Reference is once again made to FIG. 9 which shows the use of a first delay 380 and a second delay 382 in connection with generating the signals CLKM, CLK and CLKP. In a preferred implementation, those delays are fixed and thus the relative positions of the division point between OP1 and OP2 and the division point between OP1 and OP3 are also fixed. For example, in a preferred implementation the fixed division points are set at or slightly less than one-quarter of the CLK period. It will be recognized that it is easier to obtain frequency lock with a relatively larger sized (wider) part OP1 (for example, at or more than one-half of the CLK period). However, the larger (wider) the part OP1, the more susceptible the system is to jitter. Thus, it would be preferred, to address issues with jitter, to have a smaller (narrower) part OP1.

Figure 13:
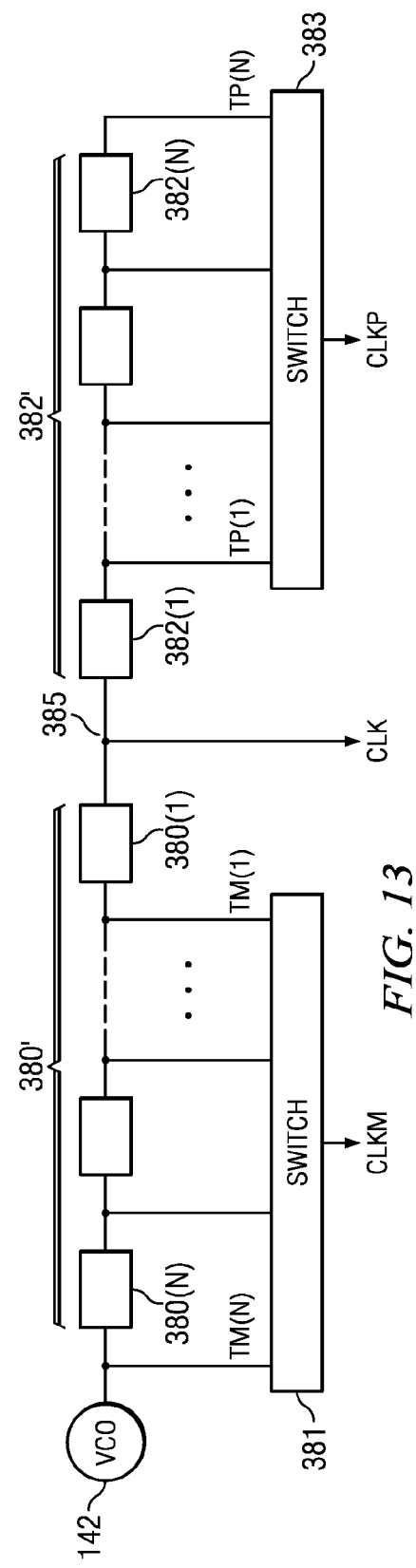
FIG. 13 illustrates an alternate circuit for signal generation.

Reference is now made to FIG. 13 which illustrates an alternate circuit for generating the signals CLKM, CLK and CLKP. In the alternate circuit, the first delay 380' and second delay 382' are capable of producing variable delays. The first delay 380' includes a plurality of first fixed delays 380(1)-380(N) connected in series. A first plurality of taps TM(1)-TM(N) are provided in the series connected first fixed delays 380(1)-380(N). The second delay likewise includes a plurality of second fixed delays 382(1)-382(N) connected in series. A second plurality of taps TP(1)-TP(N) are provided in the series connected second fixed delays 382(1)-382(N). A first switching circuit 381 is coupled to select one of the first plurality of taps TM(1)-TM(N) and output the signal CLKM. A second switching circuit 383 is coupled to select one of the second plurality of taps TP(1)-TP(N) and output the signal CLKP. The signal CLK is taken at the series connection point 385 between the first delay 380' and second delay 382'.

The size of the part OP1 is selected through operation of the first switching circuit 381 and second switching circuit 383. For example, relatively wider parts OP1 are provided when the first switching circuit 381 and second switching circuit 383 choose lower numbered taps TP and TM (i.e., taps closer to the series connection point 385 between the first delay 380' and second delay 382' where signal CLK is obtained). Conversely, relatively narrower parts OP1 are provided when the first switching circuit 381 and second switching circuit 383 choose higher numbered taps TP and TM (i.e., taps farther away from the series connection point 385 between the first delay 380' and second delay 382' where signal CLK is obtained).

To perform a jitter optimization operation, the processes for frequency control and phase control can start with a selection the first switching circuit 381 and second switching circuit 383 of a relatively wider part OP1. If no lock is obtained, the selected width of the part OP1 is maintained. However, if lock is obtained at this selection, then a new selection is made by the first switching circuit 381 and second switching circuit 383 which slightly narrows the part OP1, and the process attempts to obtain lock at this slightly narrower part OP1. The process is repeated with a narrowing of the part OP1 with each consecutive successful lock. In this way, a relatively wider part OP1 may be used in connection with initial frequency and phase setting, while a relatively narrower part OP1 is used in a low jitter fine tuning process, specifically with respect to phase control.

While this detailed description has set forth some embodiments of the present invention, the appended claims cover other embodiments of the present application which differ from the described embodiments according to various modifications and improvements. Other applications and configurations may be apparent to the person skilled in the art.

What is claimed is:

1. A clock recovery circuit, comprising:
a control circuit adapted to receive a first clock signal at a first frequency, a frequency division signal specifying a divisor number, and a second clock signal at a second frequency, wherein the second frequency is higher than the first frequency, the control circuit comprising:
a phase control block adapted to define non-overlapping portions of a pulse of the second clock including a center portion, left portion and right portion and determine whether an edge of the first clock is located within the center portion; and
a frequency control block responsive to the determination that the edge of the first clock is located within the center portion and adapted to compare a number of periods of the second clock signal which occur within one or more periods of the first clock signal to a number derived from the divisor number and generate a frequency selection signal in response thereto; and
a controlled oscillator circuit adapted to generate the second clock signal at the second frequency, wherein the second frequency is specified by the frequency selection signal.

2. The circuit of claim 1,
wherein the phase control block is further adapted to determine whether an edge of the first clock is located within the left portion and in response thereto generate a phase adjustment signal; and
wherein the second frequency of the second clock signal generated by the controlled oscillator circuit is specified by both the frequency selection signal and the phase adjustment signal, the phase adjustment signal causing the edge of the first clock to shift towards the center portion.

3. The circuit of claim 1,
wherein the phase control block is further adapted to determine whether an edge of the first clock is located within the right portion and in response thereto generate a phase adjustment signal; and
wherein the second frequency of the second clock signal generated by the controlled oscillator circuit is specified by both the frequency selection signal and the phase adjustment signal, the phase adjustment signal causing the edge of the first clock to shift towards the center portion.

4. The circuit of claim 1,
wherein the phase control block is further adapted to determine whether an edge of the first clock is located within the left portion and in response thereto generate a first phase adjustment signal;
wherein the phase control block is further adapted to determine whether an edge of the first clock is located within the right portion and in response thereto generate a second phase adjustment signal; and
wherein the second frequency of the second clock signal generated by the controlled oscillator circuit is specified by the frequency selection signal, the first phase adjustment signal and the second phase adjustment signal, the first and second phase adjustment signals causing the edge of the first clock to shift towards the center portion.

5. The circuit of claim 1, wherein the control circuit is adapted to operate in a calibration mode and a lock mode, wherein the calibration mode implements interleaved actuation of the phase control block and frequency control block, and wherein the lock mode implements actuation only of the phase control block.

6. The circuit of claim 1, wherein the control circuit is adapted to operate in a fast calibration mode, a fine calibration mode and a lock mode, wherein both the fast and fine calibration modes each implement interleaved actuation of the phase control block and frequency control block, and wherein the lock mode implements actuation only of the phase control block.

7. The circuit of claim 6, wherein actuation of the frequency control block in the fast calibration mode compares the number of periods of the second clock signal which occur within only one period of the first clock signal to the divisor number itself and generates the frequency selection signal in response thereto.

8. The circuit of claim 7, wherein actuation of the frequency control block in the fine calibration mode compares the number of periods of the second clock signal which occur within a plurality of N periods of the first clock signal to the number equal to N times the divisor number and generates the frequency selection signal in response thereto.

9. The circuit of claim 1, wherein the frequency selection signal is generated by the frequency control block by execution of a binary search algorithm.

10. The circuit of claim 1, wherein the frequency selection signal is generated by the frequency control block by an increment/decrement algorithm.

11. The circuit of claim 10, wherein each increment or decrement is a single step.

12. The circuit of claim 1, wherein a size of each of the center portion, left portion and right portion is fixed.

13. The circuit of claim 1, wherein a size of each of the center portion, left portion and right portion is variable.

14. The circuit of claim 13, wherein the size of the center portion is wider during frequency selection and narrower during phase selection.

15. The circuit of claim 1, wherein the frequency control block is further adapted to generate the frequency selection signal having a fractional value.

16. A method, comprising:
receiving a first clock signal at a first frequency;
receiving a frequency division signal specifying a divisor number;
receiving a second clock signal at a second frequency, wherein the second frequency is higher than the first frequency;
defining non-overlapping portions of a pulse of the second clock including a center portion, left portion and right portion;
determining whether an edge of the first clock is located within the center portion;
when the edge of the first clock is located within the center portion, comparing a number of periods of the second clock signal which occur within one or more periods of the first clock signal to a number derived from the divisor number;
generating a frequency selection signal in response to said comparison; and
generating the second clock signal at the second frequency, wherein the second frequency is specified by the frequency selection signal.

17. The method of claim 16, further comprising:
determining whether an edge of the first clock is located within the left portion; and
generating a phase adjustment signal in response to said determination;
wherein generating the second clock signal comprises generating the second clock signal at the second frequency, wherein the second frequency is specified by both the frequency selection signal and the phase adjustment signal, the phase adjustment signal causing the edge of the first clock to shift towards the center portion.

18. The method of claim 16, further comprising:
determining whether an edge of the first clock is located within the right portion; and
generating a phase adjustment signal in response to said determination;
wherein generating the second clock signal comprises generating the second clock signal at the second frequency, wherein the second frequency is specified by both the frequency selection signal and the phase adjustment signal, the phase adjustment signal causing the edge of the first clock to shift towards the center portion.

19. The method of claim 16,
first determining whether an edge of the first clock is located within the left portion; and
generating a first phase adjustment signal in response to said first determination;
second determining whether an edge of the first clock is located within the right portion; and
generating a phase adjustment signal in response to said second determination;
wherein generating the second clock signal comprises generating the second clock signal at the second frequency, wherein the second frequency is specified by the frequency selection signal, the first phase adjustment signal and the second phase adjustment signal, the first and second phase adjustment signals causing the edge of the first clock to shift towards the center portion.

20. The method of claim 16, further comprising:
operating in a calibration mode and a lock mode;
wherein the calibration mode implements an interleaved phase control operation and frequency control operation, and wherein the lock mode implements only the phase control operation.

21. The method of claim 16, further comprising:
operating in a fast calibration mode, a fine calibration mode and a lock mode;
wherein both the fast and fine calibration modes implement an interleaved phase control operation and frequency control operation, and wherein the lock mode implements only the phase control operation.

22. The method of claim 21, wherein comparing the number of periods of the second clock signal which occur within one or more periods of the first clock signal to the number derived from the divisor number comprises, when in the fast calibration mode, comparing the number of periods of the second clock signal which occur within only one period of the first clock signal to the divisor number itself.

23. The method of claim 22, wherein comparing the number of periods of the second clock signal which occur within one or more periods of the first clock signal to the number derived from the divisor number comprises, when in the fine calibration mode, comparing the number of periods of the second clock signal which occur within a plurality of N periods of the first clock signal to the number equal to N times the divisor number and generates the frequency selection signal in response thereto.

24. The method of claim 16, wherein generating a frequency selection signal comprises executing a binary search algorithm.

25. The method of claim 16, wherein generating a frequency selection signal comprises executing an increment/decrement algorithm.

26. The method of claim 25, wherein each increment or decrement is a single step.

27. The method of claim 16, further comprising fixing a size of each of the center portion, left portion and right portion.

28. The method of claim 16, further comprising varying a size of each of the center portion, left portion and right portion.

29. The method of claim 28, wherein the size of the center portion is wider during frequency selection and narrower during phase selection.

30. The method of claim 16, wherein the frequency selection signal has a fractional value.

* * * * *